US008613996B2

(12) United States Patent
Farooq et al.

(10) Patent No.: US 8,613,996 B2
(45) Date of Patent: Dec. 24, 2013

(54) POLYMERIC EDGE SEAL FOR BONDED SUBSTRATES

(75) Inventors: Mukta G. Farooq, Hopewell Junction, NY (US); Thomas F. Houghton, Hopewell Junction, NY (US); Nitin Parbhoo, Hopewell Junction, NY (US); Richard P. Volant, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 978 days.

(21) Appl. No.: 12/603,002

(22) Filed: Oct. 21, 2009

(65) Prior Publication Data

US 2011/0091685 A1 Apr. 21, 2011

(51) Int. Cl.
*B32B 7/00* (2006.01)
(52) U.S. Cl.
USPC ......... 428/192; 428/66.4; 428/66.7; 428/189; 428/195.1; 428/201; 439/545
(58) Field of Classification Search
USPC ................ 428/66.7, 66.4, 189, 195.1, 201; 439/545
See application file for complete search history.

(56) References Cited

U.S. PATENT DOCUMENTS

| 6,238,951 | B1 | 5/2001 | Caillat | |
| 6,979,597 | B2 | 12/2005 | Geefay et al. | |
| 7,087,538 | B2 * | 8/2006 | Staines et al. | 438/782 |
| 7,192,841 | B2 | 3/2007 | Wei et al. | |
| 7,303,976 | B2 | 12/2007 | Sand | |
| 7,557,898 | B2 | 7/2009 | Tasaka et al. | |
| 8,119,500 | B2 * | 2/2012 | Yang et al. | 438/459 |
| 2004/0195658 | A1 * | 10/2004 | Nakayama et al. | 257/618 |
| 2007/0155129 | A1 | 7/2007 | Thallner | |
| 2007/0161149 | A1 | 7/2007 | Lin et al. | |
| 2008/0164606 | A1 | 7/2008 | Greisen et al. | |
| 2008/0268614 | A1 * | 10/2008 | Yang et al. | 438/455 |

* cited by examiner

*Primary Examiner* — Mark Ruthkosky
*Assistant Examiner* — Christopher Polley
(74) *Attorney, Agent, or Firm* — Scully, Scott, Murphy & Presser, P.C.; Joseph P. Abate, Esq.

(57) ABSTRACT

A layer of polymer material is applied on a peripheral region of at least one of the two substrates to be bonded prior to bonding. The bonded structure formed thereby includes a first substrate, a second substrate in direct contact with the first substrate, and a ring of the polymer material in direct contact with the first substrate at a first interface and in direct contact with the second substrate. The ring of polymer material laterally surrounds and seals the interface at which the first substrate contacts the second substrate. A ring-shaped cavity can be formed within the polymeric ring. Alternately, the first interface and the second interface can be contiguous without a ring-shaped cavity between the first and second substrates.

17 Claims, 4 Drawing Sheets

POLYMERIC EDGE SEAL FOR BONDED SUBSTRATES

BACKGROUND

This invention relates to a bonded structure having a polymeric edge seal between two bonded substrates and methods of manufacturing the same.

Bonding of multiple substrates is required to enable three-dimensional integration of chips. Because typical substrates have a tapered or rounded surface at the periphery, the contact between two bonded substrates is limited to an area that excludes the periphery of the substrates. The taper or rounding of the surfaces may be caused, for example, by lack of masking on the peripheral area of a substrate during an etch, or by a chuck that presses the substrate down during deposition, thereby blocking deposition of material on the peripheral area.

Through-substrate-via (TSV) structures, formed after multiple substrates are bonded and optionally thinned, provide electrical connection across the multiple substrates in a bonded structure. A TSV structure includes a conductive material such as copper, which diffuses rapidly in the plane of the bonding interface between substrates because microscopic irregularities and cavities are present at the interface. Diffusion of the conductive material from a TSV structure can cause electrical shorts and reliability problems in the bonded structure.

Between the step of bonding of two substrates and the step of formation of TSV structures, one or both of the substrates in the bonded structure may be thinned to facilitate formation of TSV structures. The thinning process employs slurries for planarization and generates particles of the material removed from the substrate(s) of the bonded structure. Such materials generated or applied during the thinning process tend to get into the space at the interface between two bonded substrates. Thus, semiconductor devices at the interface of a bonded structure may be subjected to such materials during the thinning process.

Further, the bonded structure may be subjected to wet processing steps, such as wet etching or a wet clean, that are intended to treat exposed back surfaces and/or surfaces within through substrate cavities within the bonded structure. During such wet processing steps, however, semiconductor structures at the interface between the bonded substrates can be exposed to a wet chemical that seeps in from the periphery of the bonded substrates. Thus, semiconductor devices at the interface of a bonded structure may be subjected an unintentional exposure to wet chemicals employed in processing steps after bonding.

BRIEF SUMMARY

In an embodiment of the present invention, a layer of polymer material is applied on a peripheral region of at least one of the two substrates to be bonded prior to bonding. The bonded structure formed thereby includes a first substrate, a second substrate in direct contact with the first substrate, and a ring of the polymer material in direct contact with the first substrate at a first interface and in direct contact with the second substrate. The ring of polymer material laterally surrounds and seals the interface at which the first substrate contacts the second substrate. A ring-shaped cavity can be formed within the ring of polymer material. Alternately, the first interface and the second interface can be contiguous without a ring-shaped cavity between the first and second substrates.

According to an aspect of the present invention, a bonded structure is provided, which includes a first substrate having a first flat surface, a second substrate having a second flat surface that is bonded to the first flat surface at an intersubstrate interface, and a polymeric ring contacting a first non-flat surface of the first substrate at a first polymer-to-non-polymer interface and a second non-flat surface of the second substrate at a second polymer-to-non-polymer interface.

According to another aspect of the present invention, a method of forming a bonded structure is provided. The method includes applying a polymer material on a surface of a first substrate; bonding a second substrate to the surface of the first substrate, wherein adhesion between the first and second substrates is provided by bonding of materials across an intersubstrate interface between the first and second substrates; and forming a polymeric ring including the polymer material, wherein the polymeric ring contacts a first non-flat surface of the first substrate at a first polymer-to-non-polymer interface and a second non-flat surface of the second substrate at a second polymer-to-non-polymer interface.

DETAILED DESCRIPTION

As stated above, the present invention relates to a bonded structure having a polymeric edge seal between two bonded substrates and methods of manufacturing the same, which are now described in detail with accompanying figures. The drawings are not necessarily drawn to scale.

As used herein, a "flat surface" is a surface that is coincident with a portion of a two-dimensional plane.

As used herein, a "non-flat surface" is a surface for which a two-dimensional plane that coincides with the surface does not exist.

As used herein, an "intersubstrate interface" is an interface between a first substrate and a second substrate.

As used herein, a "polymer" is a molecule synthesized through the process of polymerization of monomers and including repeating structural units connected by chemical bonds.

As used herein, a "polymer material" is a material composed of a polymer.

As used herein, a "non-polymer material" is a material that is not composed of a polymer.

As used herein, a "poly-to-non-polymer interface" is an interface between a polymer material and a non-polymer material.

As used herein, a "ring" is an element having a three-dimensional shape that may be contiguously stretched or deformed to a torus without forming or destroying a contact between any pair of points in the three-dimensional shape.

As used herein, an element is "ring-shaped" if it has a shape of a ring.

As used herein, a "polymeric ring" is a ring composed of at least one polymer.

As used herein, a "periphery" is a one-dimensional closed shape that may be contiguously stretched or deformed to a circle without forming or destroying a contact between any pair of points in the one-dimensional closed shape.

As used herein, an "adhesive" is a material or a compound that adheres or bonds items together by an increase in the adhesive force of the material upon application.

As used herein, an "exposure-hardened photosensitive material" is a photosensitive material that is exposed to an electromagnetic radiation and hardened, i.e., has become more structurally stable than before exposure, by the exposure to the electromagnetic radiation.

As used herein, to "overlie" an element means to be located above or below that element in a vertical direction from a surface of the element.

Figure 1:
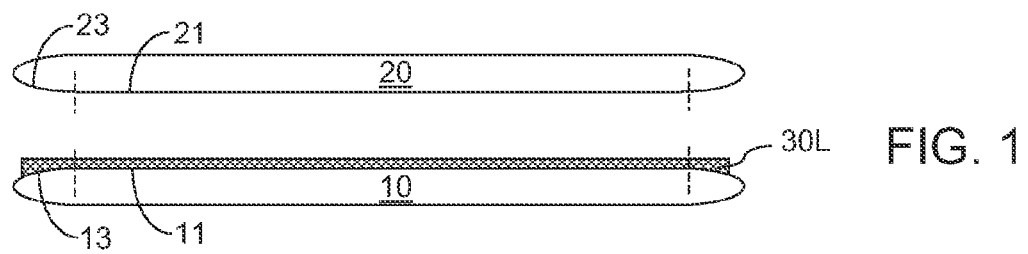
FIG. 1 is a vertical cross-sectional view of a first exemplary structure after application of a polymer material according to a first embodiment of the present invention.

Referring to FIG. 1, a first exemplary structure according to a first embodiment of the present invention includes a first substrate 10 and a second substrate 20. Each of the first substrate 10 can include a semiconductor substrate, an insulator substrate, a conductor substrate, or a composite substrate including at least two substrates. For example, each of the first and second substrates (10, 20) can include a semiconductor substrate including a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

If one or both of the first and second substrates (10, 20) includes a semiconductor substrate, the semiconductor substrate may, or may not, be a single crystalline substrate. At least one semiconductor device (not shown) can be present on or in the semiconductor substrate. The at least one semiconductor device can be, but is not limited to, a field effect transistor, a bipolar transistor, a diode, a resistor, a capacitor, a varactor, an inductor, a carbon nanotube device, or any other type of semiconductor device or a nanoscale device. The semiconductor substrate can include at least one doped region (not shown) therein.

Further, each of the first and second substrates (10, 20) can include at least one dielectric material layer (now shown). The at least one dielectric material layer includes at least one dielectric material, which can be a doped or undoped silicate glass, silicon nitride, a low dielectric constant (low-k) chemical vapor deposition (CVD) material such as organosilicate glass, a low-k spin-on dielectric material such as SiLK™, BLoK™, NBLoCK™, or any other type of dielectric material that can be deposited or formed on a substrate and able to hold at least one metal pad therein. Further, at least one metal interconnect structure (not shown) can be embedded in the at least one dielectric material layer to provide electrical connection to the at least one semiconductor device, if present, in the first or second substrates (10, 20).

A polymer layer 30L composed of a polymer material is formed on a surface of the first substrate 10. The surface on which the polymer layer 30L is formed is herein referred to as a first surface. The first surface includes a first flat surface 11, which is the flat portion of the first surface, and a first non-flat surface 13, which is the non-flat portion of the first surface. The first non-flat surface 13 is located at a peripheral region of the first substrate 10, and the first flat surface 11 is located within an area surrounded by the peripheral region. A dotted line marks the periphery of the first flat surface 11 that adjoins the inner periphery of the first non-flat surface 13. The closed one-dimensional curve can be a circle, or a closed one-dimensional shape substantially similar to a circle.

The polymer material in the polymer layer 30L can be any polymer material that can provide a seal between the first substrate 10 and the second substrate 20 upon bonding. The polymer material can be, but is not limited to, polyimide, BCB (benzocyclobutene) or fluorinated polyimides, polyorganohydrosilane, polyphenylenes, polysiloxanes, copolymers of divinylsiloxane and bisbenzocyclobutene, polybenzil, polyarylethers and polytetraflurorethylene, and a photosensitive polymer. An example of a photosensitive polymer is photosensitive polyimide. The polymer material can be applied, for example, by spin coating or any other method that forms a contiguous layer. The thickness of the polymer layer 30L can be from 50 nm to 10,000 nm, and typically from 500 nm to 5,000 nm, although lesser and greater thicknesses can also be employed. The polymer layer 30L covers the entirety of the first flat surface 11 and a portion of the first non-flat surface 13. Preferably, the entirety of the inner periphery of the non-flat surface 13, which coincides with the periphery of the first flat surface 11, is covered with the polymer layer 13.

The polymer material in the polymer layer 30L is not an adhesive. The polymer material in the polymer layer 30L maintains viscosity after application such that subsequent squeezing of the polymer material induces viscous movement of the polymer material.

In case the first substrate 10 includes a semiconductor substrate typically employed in semiconductor manufacturing, the first substrate 10 can have a diameter from 150 mm to 300 mm. In this case, the diameter of the first flat surface 10 can be from 138 mm to 296 mm. The shape of the first non-flat surface 13, as seen from above the first substrate 10, can be an annulus having a width from 2 mm to 6 mm depending on the width of edge exclusion employed in semiconductor manufacturing steps, although lesser and greater widths of the annulus can also be employed.

The portion of the surface of the second substrate 20 to be subsequently bonded to the first flat surface 11 is herein referred to as a second flat surface 21. The non-flat surface that borders on the periphery of the second flat surface 21 is herein referred to as a second non-flat surface 23. The first flat surface 21 and the first non-flat surface 23 are collectively referred to as a second surface (21, 23). The second non-flat surface 23 is located at a peripheral region of the second substrate 20, and the second flat surface 21 is located within an area surrounded by the peripheral region. A dotted line marks the periphery of the second flat surface 21 that adjoins the inner periphery of the second non-flat surface 23. The closed one-dimensional curve can be a circle, or a closed one-dimensional shape substantially similar to a circle. Preferably, the shape of the first flat surface 11 and the shape of the second flat surface 21 are mirror images of each other.

Figure 2:
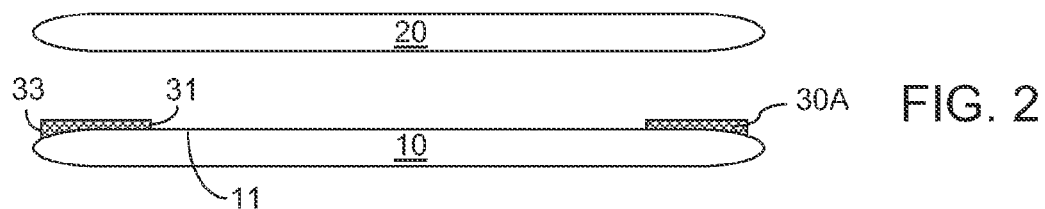
FIG. 2 is a vertical cross-sectional view of the first exemplary structure prior to bonding according to the first embodiment of the present invention.
Figure 3:
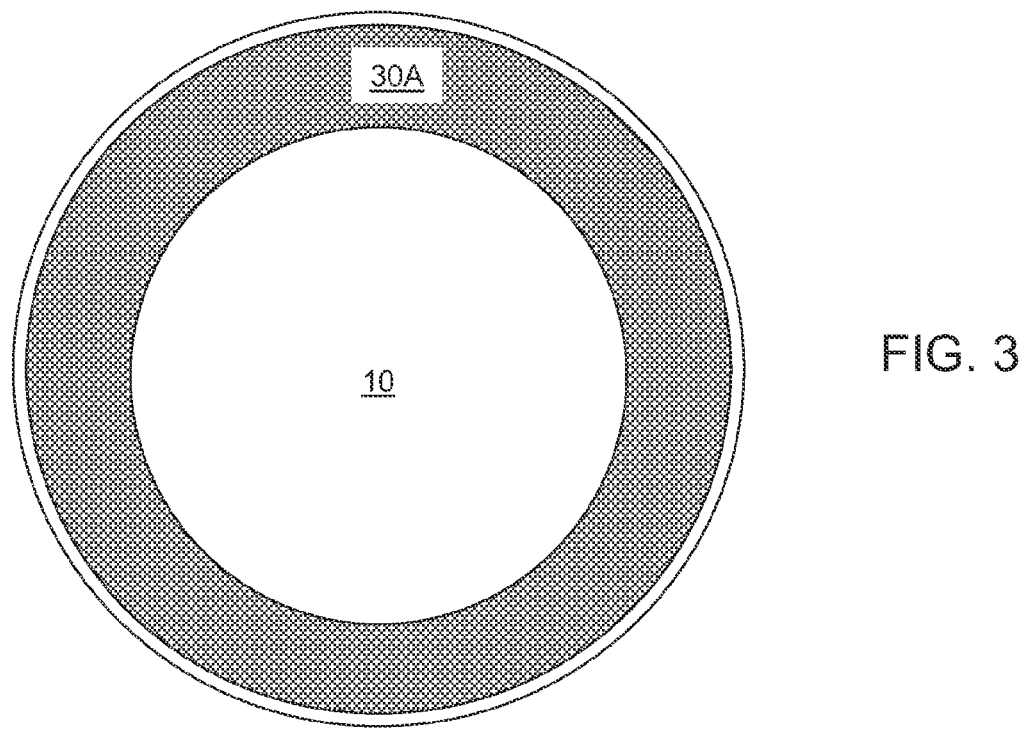
FIG. 3 is a top-down view of the first substrate with a coated polymer material in the first exemplary structure according to the first embodiment of the present invention.

Referring to FIGS. 2 and 3, a portion of the polymer material in the polymer layer 30L is removed from above a center portion of the first flat surface 11 of the first substrate 10. The remaining portion of the polymer material, located over an outer portion of the first flat surface 11 and over the first non-flat surface 13, is herein referred to as a polymer material portion 30A. The polymer material portion 30A is ring-shaped, and covers the outer portion of the first flat surface 11 and an inner portion of the first non-flat surface 13. The polymer material portion 30A has an inner sidewall 31 and an outer sidewall 33. In case the first substrate 10 has a circular horizontal cross-sectional area, each of the inner sidewall 31 and the outer sidewall 33 can be cylindrical surfaces with a constant radius. The radius of the inner sidewall 31 can be from 30% to 95% of the radius of the first substrate 10, and the radius of the outer sidewall 33 can be from above 95% to 100% of the radius of the first substrate 10, although lesser and greater ranges can also be employed.

Figure 4:
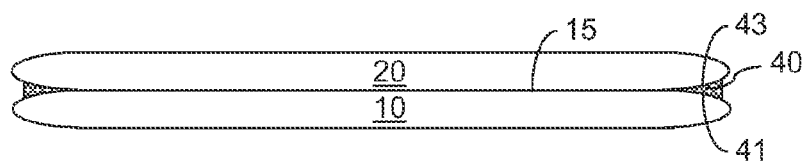
FIG. 4 is a vertical cross-sectional view of the first exemplary structure after bonding and formation of a ring of polymer material according to the first embodiment of the present invention.
Figure 5:
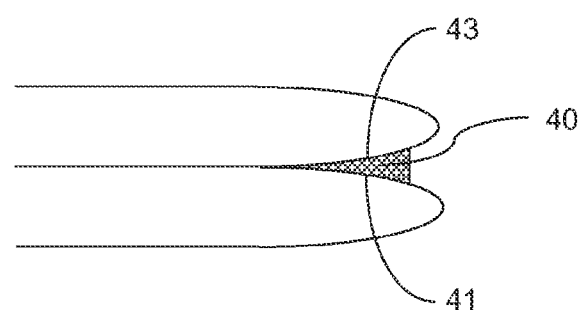
FIG. 5 is a magnified view of an edge region of the first exemplary structure in FIG. 4.

Referring to FIGS. 4 and 5, the second flat surface of the second substrate 20 is brought into physical contact with the first flat surface of the first substrate 10 at an intersubstrate interface 15. The polymer material portion 30A is squeezed out from the area of the intersubstrate interface 15 toward the peripheral portions of the first substrate 10 and the second substrate 20 during the process in which the first and second substrates (10, 20) make a physical contact. The polymer material pushed out toward the peripheral regions of the first and second substrates (10, 20) seal a volume surrounding the first and second substrates (10, 20) and form a polymeric ring 40.

The first substrate 10 and the second substrate 20 are bonded at the intersubstrate interface 15 by methods known in the art. For example, each of the first flat surface and the second flat surface can include a bondable dielectric material such as silicon oxide or copper. Further, each of the first flat surface and the second flat surface can be a patterned surface having two different bondable materials such as a patterned surface of silicon oxide and copper. Adhesion between the first and second substrates (10, 20) is provided by bonding of materials across the intersubstrate interface 15 between the first and second substrates (10, 20).

The polymeric ring 40 contacts the first non-flat surface of the first substrate 10 at a first polymer-to-non-polymer interface 41 and the second non-flat surface of the second substrate 20 at a second polymer-to-non-polymer interface 43. At the first polymer-to-non-polymer interface 41 and the second polymer-to-non-polymer interface 43, the polymeric ring 40 makes a physical contact with the first or second substrate (10 or 20) and provides a seal that prevents ingress of solid material or liquid during subsequent planarization and wet processing steps.

The first polymer-to-non-polymer interface 41 contiguously encircles the first substrate 10, and the second polymer-to-non-polymer interface 43 contiguously encircles the second substrate 20. The polymeric ring 40 is a ring-shaped single contiguous structure that laterally encircles said intersubstrate interface 15. The polymeric ring 40, the first substrate 10, and the second substrate 20 encapsulate an entirety of the intersubstrate interface 15.

In case the polymeric ring 40 is composed of a photosensitive material such as photosensitive polyimide, the outer surfaces of the polymeric ring 40 can be exposed to electromagnetic radiation to convert the photosensitive material into an exposure-hardened photosensitive material. The conversion of the photosensitive material into the exposure-hardened photosensitive material can be partial or complete.

The outer surface of the polymeric ring 40 contiguously contacts a periphery of the first polymer-to-non-polymer interface 41 and a periphery of the second polymer-to-non-polymer interface 43. The periphery of the intersubstrate interface 15 contacts an inner periphery of the first polymer-to-non-polymer interface 41 and an inner periphery of the second polymer-to-non-polymer interface 43. The inner periphery of the first polymer-to-non-polymer interface 41, the inner periphery of the second polymer-to-non-polymer interface 43, and the periphery of the intersubstrate interface 15 coincide with one another. The polymer material laterally surrounds the intersubstrate interface 15. The polymeric ring 40, the first substrate 10, and the second substrate 20 encapsulate the intersubstrate interface 15.

Figure 6:
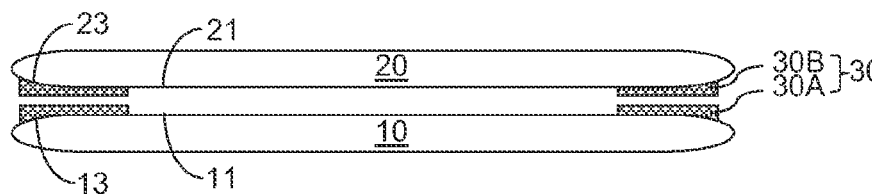
FIG. 6 is a vertical cross-sectional view of a first variation of the first exemplary structure prior to bonding according to a first variation of the first embodiment of the present invention.

Referring to FIG. 6, a first variation of the first exemplary structure includes the first substrate 10 on which a polymer material portion 30A is present as in FIG. 2. Prior to bonding of the first and second substrates (10, 20), a second polymer material is applied on the second surface (21, 23) of the second substrate 20. Any material that can be employed for the polymer material portion 30A can be employed as the polymer material of the second polymer material portion 30B. The second polymer material can be applied as a layer and subsequently patterned to remove a center portion thereof. The remaining portion of the second polymeric material constitutes a second polymeric material portion 30B. The polymeric material portion 30A and the second polymeric material portion 30 are collectively referred to as polymer material portions 30.

The second polymer material portion 30B is ring-shaped, and covers the outer portion of the second flat surface 21 and an inner portion of the second non-flat surface 23. The second polymer material portion 30B has an inner sidewall and an outer sidewall. In case the second substrate 20 has a circular horizontal cross-sectional area, each of the inner sidewall and the outer sidewall can be cylindrical surfaces with a constant radius. The radius of the inner sidewall can be from 30% to 95% of the radius of the second substrate 20, and the radius of the outer sidewall can be from above 95% to 100% of the radius of the second substrate 20, although lesser and greater ranges can also be employed.

As in the first embodiment, the second flat surface (21, 23) of the second substrate 20 is brought into physical contact with the first surface (11, 13) of the first substrate 10 at an intersubstrate interface. The polymer material portions 30, i.e., the polymer material portion 30A and the second polymeric material portion 30B, are squeezed out from the area of the intersubstrate interface toward the peripheral portions of the first substrate 10 and the second substrate 20 during the process in which the first and second substrates (10, 20) make a physical contact. The polymer materials pushed out toward the peripheral regions of the first and second substrates (10, 20) seal a volume surrounding the first and second substrates (10, 20) and form a polymeric ring 40, which includes the polymeric material of the polymer material portion 30A and the polymeric material of the second polymer material portion 30B.

The first substrate 10 and the second substrate 20 are bonded at the intersubstrate interface as in the first embodiment to form a bonded structure, which can be the same as the bonded structure of the first embodiment shown in FIG. 4. If any of the polymer material portion 30A and the second polymer material portion 30B is composed of a photosensitive material such as photosensitive polyimide, the outer surfaces of the polymeric ring 40 can be exposed to electromagnetic radiation to convert the photosensitive material into an exposure-hardened photosensitive material as in the first embodiment.

Figure 7:
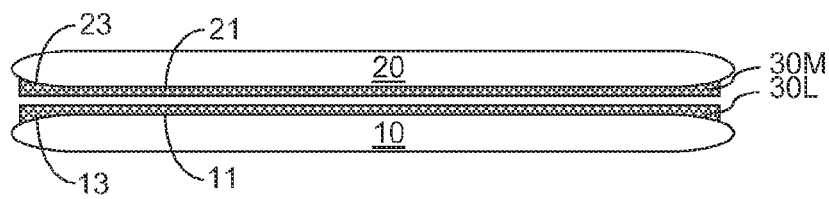
FIG. 7 is a vertical cross-sectional view of a second variation of the first exemplary structure prior to bonding according to a second variation of the first embodiment of the present invention.

Referring to FIG. 7, a second variation of the first exemplary structure includes the first substrate 10 on which a polymer material layer 30L is present as in FIG. 1. The composition of the polymer material layer 30L can be the same as in the first embodiment. In addition, a second polymer material is applied on the second surface (21, 23) of the second substrate 20 to form a second polymer material layer 30M. Any material that can be employed for the polymer material portion 30A can be employed as the polymer material of the second polymer material layer 30M. The second polymer material layer 30M is a contiguous layer without a hole, and covers the entirety of the second flat surface 21 and an inner portion of the second non-flat surface 23.

Each of the first and second polymer material layers (30L, 30M) has a sidewall. In case the first and second polymer material layers (30L, 30M) have circular horizontal cross-sectional areas, the sidewalls of the first and second polymer material layers (30L, 30M) can be cylindrical surfaces with a constant radius. For example, the radius of each sidewall can be from 95% to 100% of the radius of each substrate, although lesser and greater ranges can also be employed.

As in the first embodiment, the second flat surface (21, 23) of the second substrate 20 is brought into physical contact with the first surface (11, 13) of the first substrate 10 at an intersubstrate interface. The polymer material layer 30L and the second polymeric material layer 30M are squeezed out from the area of the intersubstrate interface toward the peripheral portions of the first substrate 10 and the second substrate 20 during the process in which the first and second substrates (10, 20) make a physical contact. The polymer materials pushed out toward the peripheral regions of the first and second substrates (10, 20) seal a volume surrounding the first and second substrates (10, 20) and form a polymeric ring 40, which includes the polymeric material of the polymer material layer 30L and the polymeric material of the second polymer material layer 30M.

The first substrate 10 and the second substrate 20 are bonded at the intersubstrate interface as in the first embodiment to form a bonded structure, which can be the same as the bonded structure of the first embodiment shown in FIG. 4. If any of the polymer material layer 30L and the second polymer material layer 30M is composed of a photosensitive material such as photosensitive polyimide, the outer surfaces of the polymeric ring 40 can be exposed to electromagnetic radiation to convert all, or a portion, of the photosensitive material into an exposure-hardened photosensitive material as in the first embodiment.

Figure 8:
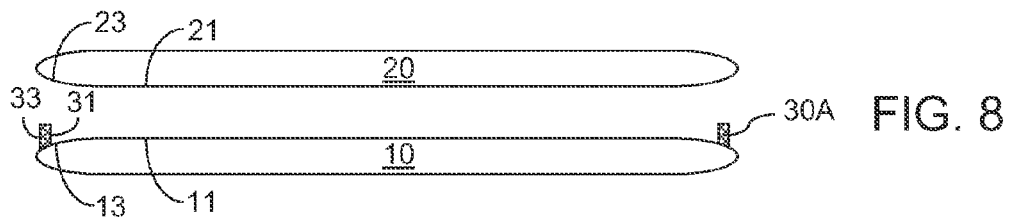
FIG. 8 is a vertical cross-sectional view of a second exemplary structure prior to bonding according to a second embodiment of the present invention.
Figure 9:
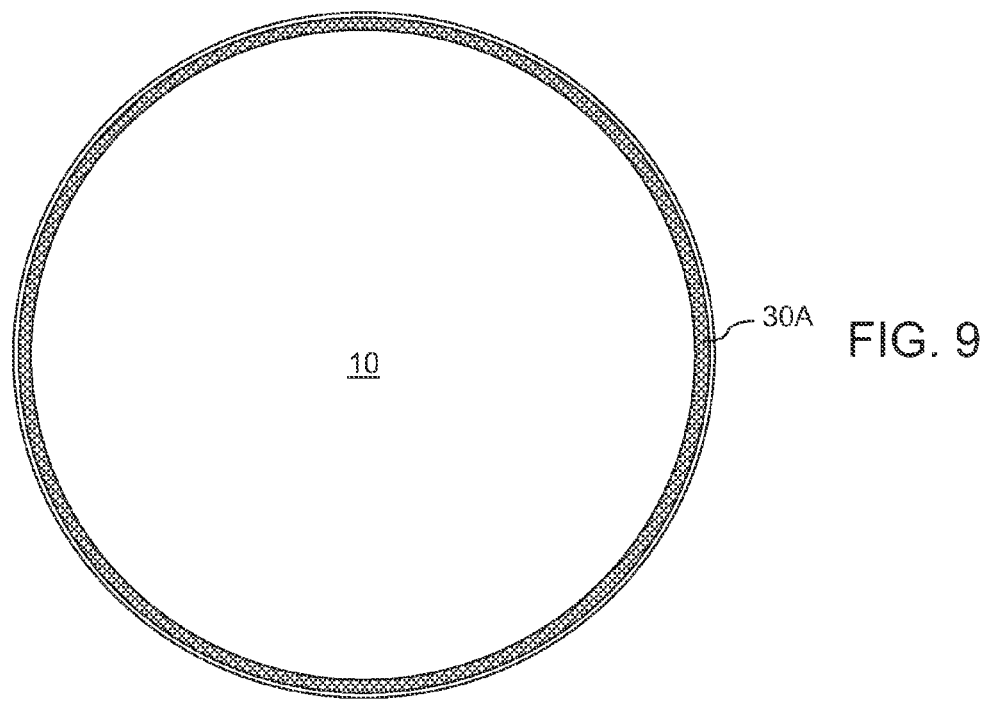
FIG. 9 is a top-down view of the first substrate with a coated polymer material in the second exemplary structure according to the second embodiment of the present invention.

Referring to FIGS. 8 and 9, a second exemplary structure according to a second embodiment of the present invention can be derived from the first exemplary structure of the first embodiment in FIG. 1 by removing a center portion of the polymer material layer 30L (See FIG. 1). All of the first flat surface 11 is exposed after removal of the center portion of the polymer material layer 30L. The remaining portion of the polymer material, located only over the first non-flat surface 13, constitutes a polymer material portion 30A. The polymer material portion 30A is ring-shaped, and covers a middle portion of the first non-flat surface 13. The polymer material portion 30A is spaced from the periphery of the first flat surface 11. The polymer material portion 30A has an inner sidewall 31 and an outer sidewall 33. The entirety of the inner sidewall 31 and the outer sidewall 33 overlie the first non-flat surface 13.

In case the first substrate 10 has a circular horizontal cross-sectional area, each of the inner sidewall 31 and the outer sidewall 33 can be cylindrical surfaces with a constant radius. The radius of the inner sidewall 31 can be from 95% to 98% of the radius of the first substrate 10, and the radius of the outer sidewall 33 can be from above 96% to 100% of the radius of the first substrate 10, although lesser and greater ranges can also be employed.

Alternately, the polymer material portion 30A can be formed by applying a polymer material in the form of a strip at a width that is less than the width of the first non-flat surface 13. The extent of the applied polymer material is limited to the area of the first non-flat surface 13. The strip of the applied polymer material is spaced from the periphery of the first flat surface 11. The polymer material portion 30A is formed as a ring-shaped structure.

Figure 10:
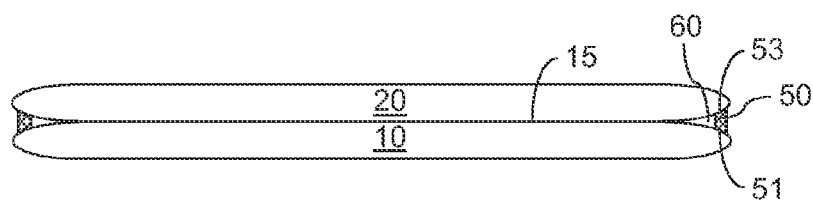
FIG. 10 is a vertical cross-sectional view of the second exemplary structure after bonding and formation of a ring of polymer material according to the second embodiment of the present invention.
Figure 11:
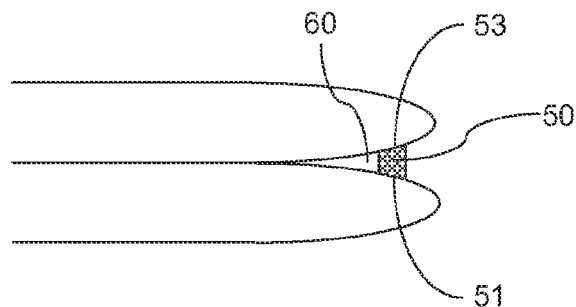
FIG. 11 is a magnified view of an edge region of the second exemplary structure in FIG. 10.

Referring to FIGS. 10 and 11, the second flat surface of the second substrate 20 is brought into physical contact with the first flat surface of the first substrate 10 at an intersubstrate interface 15 as in the first embodiment. The polymer material portion 30A makes a physical contact with the second non-flat surface of the second substrate during the process in which the first and second substrates (10, 20) make a physical contact. The polymer material forms a polymeric ring 50, which seals a volume surrounding the first and second substrates (10, 20) and a ring-shaped cavity 60 thereabout.

The first substrate 10 and the second substrate 20 are bonded at the intersubstrate interface 15 by methods known in the art as in the first embodiment. Adhesion between the first and second substrates (10, 20) is provided by bonding of materials across the intersubstrate interface 15 between the first and second substrates (10, 20).

The polymeric ring 50 contacts the first non-flat surface of the first substrate 10 at a first polymer-to-non-polymer interface 51 and the second non-flat surface of the second substrate 20 at a second polymer-to-non-polymer interface 53. The first polymer-to-non-polymer interface 51 is a subset of the first non-flat surface, and the second polymer-to-non-polymer interface 53 is a subset of the second non-flat surface. At the first polymer-to-non-polymer interface 51 and the second polymer-to-non-polymer interface 53, the polymeric ring 50 makes a physical contact with the first or second substrate (10 or 20) and provides a seal that prevents ingress of solid material or liquid during subsequent planarization and wet processing steps.

The first polymer-to-non-polymer interface 51 contiguously encircles the first substrate 10, and the second polymer-to-non-polymer interface 53 contiguously encircles the second substrate 20. The polymeric ring 50 is a ring-shaped single contiguous structure that laterally encircles said intersubstrate interface 15. The polymeric ring 50, the first substrate 10, and the second substrate 20 encapsulate an entirety of the intersubstrate interface 15 and the ring-shaped cavity 60.

In case the polymeric ring 50 is composed of a photosensitive material such as photosensitive polyimide, the outer surfaces of the polymeric ring 50 can be exposed to electromagnetic radiation to convert the photosensitive material into an exposure-hardened photosensitive material.

The outer surface of the polymeric ring 50 contiguously contacts a periphery of the first polymer-to-non-polymer interface 51 and a periphery of the second polymer-to-non-polymer interface 53. The inner surface of the polymeric ring 50 contiguously contacts another periphery of the first polymer-to-non-polymer interface 51 and another periphery of the second polymer-to-non-polymer interface 53. The periphery of the intersubstrate interface 15 contacts an inner periphery of the first polymer-to-non-polymer interface 51 and an inner periphery of the second polymer-to-non-polymer interface 53. The inner periphery of the first polymer-to-non-polymer interface 51, the inner periphery of the second polymer-to-non-polymer interface 53, and the periphery of the intersubstrate interface 15 coincide with one another. The polymer ring 50 laterally surrounds the ring-shaped cavity 60 and the intersubstrate interface 15. The polymeric ring 40, the first substrate 10, and the second substrate 20 encapsulate the intersubstrate interface 15 and the ring-shaped cavity 60. The ring-shaped cavity 60 is encapsulated by the first substrate 10, the second substrate 20, and the polymeric ring 50. Each of a periphery of the first polymer-to-non-polymer interface 51, a periphery of the second polymer-to-non-polymer interface 53, and a periphery of the intersubstrate interface 15 borders the ring-shaped cavity 60. The first substrate 10 is bonded to the second substrate 20 through adhesive force applied across the intersubstrate interface 15, and the polymeric ring 50 is not composed of an adhesive.

In case the polymeric ring 50 is composed of a photosensitive material such as photosensitive polyimide, the outer surfaces of the polymeric ring 50 can be exposed to electromagnetic radiation to convert the photosensitive material into an exposure-hardened photosensitive material. The conversion of the photosensitive material into the exposure-hardened photosensitive material can be partial or complete.

Figure 12:
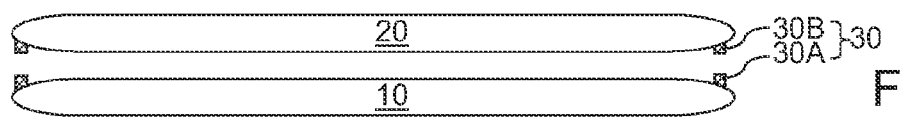
FIG. 12 is a vertical cross-sectional view of a variation of the second exemplary structure prior to bonding according to a variation of the second embodiment of the present invention.

Referring to FIG. 12, a variation of the second exemplary structure includes the first substrate 10 on which a polymer material portion 30A is present as in FIGS. 8 and 9. Prior to bonding of the first and second substrates (10, 20), a second polymer material is applied on the second non-flat surface 23 of the second substrate 20. Any material that can be employed for the polymer material portion 30A can be employed as the polymer material of the second polymer material portion 30B.

The second polymer material can be applied as a layer that covers all of the second flat surface, or can be applied as a ring-shaped strip that overlies the second non-flat surface but does not overlie the second flat surface. In case the second polymer material is formed as a strip, the second polymer material is formed as the second polymer material portion 30B upon deposition. In case the second polymer material is formed as a layer, a center portion of the second polymer material is removed from all of the second flat surface. The remaining portion of the second polymeric material after removal of the center portion constitutes the second polymeric material portion 30B. The polymeric material portion 30A and the second polymeric material portion 30 are collectively referred to as polymer material portions 30.

The second polymer material portion 30B is ring-shaped, and covers a middle portion of the second non-flat surface 23. The second polymer material portion 30B is spaced from the periphery of the second flat surface 21. The second polymer material portion 30B has an inner sidewall and an outer sidewall. The entirety of the inner sidewall and the outer sidewall overlie the second non-flat surface 23. The extent of the second polymer material portion 30B is limited to the area of the second non-flat surface 23. The strip of the second polymer material portion 30B is spaced from the periphery of the second flat surface 21. The second polymer material portion 30B is formed as a ring-shaped structure.

The second flat surface of the second substrate 20 is subsequently brought into physical contact with the first flat surface of the first substrate 10 as in the second embodiment. The polymer material portions 30, i.e., the polymer material portion 30A and the second polymeric material portion 30B, make a physical contact with each other to form a polymeric ring 50 during the process in which the first and second substrates (10, 20) make a physical contact. The polymeric ring 50 includes the material of the polymer material portion 30A and the second polymer material portion 30B, and seals a volume surrounding the first and second substrates (10, 20) and the volume of the ring-shaped cavity 60.

The first substrate 10 and the second substrate 20 are bonded at the intersubstrate interface as in the second embodiment to form a bonded structure, which can be the same as the bonded structure of the first embodiment shown in FIGS. 10 and 11. If any of the polymer material portion 30A and the second polymer material portion 30B is composed of a photosensitive material such as photosensitive polyimide, the outer surfaces of the polymeric ring 50 can be exposed to electromagnetic radiation to convert the photosensitive material into an exposure-hardened photosensitive material as in the first embodiment. The conversion of the photosensitive material into the exposure-hardened photosensitive material can be partial or complete, i.e., only an outer portion of the photosensitive material in the polymeric ring 50 can be converted into the exposure-hardened photosensitive material or all of the photosensitive material in the polymeric ring 50 can be converted into the exposure-hardened photosensitive material.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A bonded structure comprising a first substrate, a second substrate, a polymeric ring, and a ring-shaped cavity encapsulated by said first substrate, said second substrate, and said polymeric ring, wherein said first substrate includes a first flat surface, a first non-flat surface that adjoins said first flat surface at an entirety of a periphery of said first flat surface, and another surface of said first substrate that overlies said first flat surface and adjoined to a periphery of said first non-flat surface, wherein said second substrate includes a second flat surface, a second non-flat surface that adjoins said second flat surface at an entirety of a periphery of said second flat interface, and another surface of said second substrate that underlies said second flat surface and adjoined to a periphery of said second non-flat surface, wherein an entirety of an area at which said first flat surface coincides with said second flat surface constitutes an intersubstrate interface at which a bondable material within said first substrate is bonded to a bondable material within said second substrate, and wherein said polymeric ring is in direct contact with said first non-flat surface at a first polymer-to-non-polymer interface and said second non-flat surface at a second polymer-to-non-polymer interface.

2. The bonded structure of claim 1, wherein said first polymer-to-non-polymer interface contiguously extends around said first substrate, and said second polymer-to-non-polymer interface contiguously extends around said second substrate.

3. The bonded structure of claim 1, wherein said polymeric ring is a ring-shaped single contiguous structure that laterally encircles said intersubstrate interface.

4. The bonded structure of claim 1, wherein said polymeric ring includes an exposure-hardened photosensitive material.

5. The bonded structure of claim 4, wherein said polymer material is a photosensitive polyimide.

6. The bonded structure of claim 1, wherein said polymeric ring, said first substrate, and said second substrate encapsulate an entirety of said intersubstrate interface.

7. The bonded structure of claim 1, wherein an outer surface of said polymeric ring of said polymer material contiguously contacts a periphery of said first polymer-to-non-polymer interface and a periphery of said second polymer-to-non-polymer interface.

8. The bonded structure of claim 1, wherein a periphery of said intersubstrate interface contacts a periphery of said first polymer-to-non-polymer interface and a periphery of said second polymer-to-non-polymer interface.

9. The bonded structure of claim 7, wherein said periphery of said first polymer-to-non-polymer interface, said periphery of said second polymer-to-non-polymer interface, and said periphery of said intersubstrate interface coincide with one another.

10. The bonded structure of claim 1, wherein each of a periphery of said first polymer-to-non-polymer interface, a periphery of said second polymer-to-non-polymer interface, and a periphery of said intersubstrate interface borders said ring-shaped cavity.

11. The bonded structure of claim 1, wherein said first substrate is bonded to said second substrate by adhesive force applied across said intersubstrate interface, and said polymer material is not an adhesive.

12. The bonded structure of claim 1, wherein each of said first flat surface and said second flat surface includes at least one of a silicon oxide surface and a copper surface.

13. The bonded structure of claim 1, wherein said first flat surface is a patterned surface having two different bondable materials.

14. The bonded structure of claim 1, wherein said second flat surface is a patterned surface having two different bondable materials.

15. The bonded structure of claim 1, wherein each of the first flat surface and the second flat surface is a patterned surface having two different bondable materials.

16. The bonded structure of claim 15, wherein said patterned surface includes a silicon oxide surface and a copper surface.

17. The bonded structure of claim 1, wherein an entirety of a periphery of said intersubstrate interface contacts said polymeric ring.

* * * * *